(12) United States Patent
Hartman

(10) Patent No.: US 6,366,093 B1
(45) Date of Patent: Apr. 2, 2002

(54) RE-ENTRANT RF CAVITY RESONATOR FOR MAGNETIC RESONANCE

(75) Inventor: Spencer C. Hartman, Burlingame, CA (US)

(73) Assignee: Varian, Inc., Palo Alto, CA (US)

(*) Notice: Subject to any disclaimer, the term of this patent is extended or adjusted under 35 U.S.C. 154(b) by 0 days.

(21) Appl. No.: 09/615,000

(22) Filed: Jul. 12, 2000

(51) Int. Cl.$^7$ .................................................. G01U 3/00
(52) U.S. Cl. ....................... 324/318; 324/322; 324/321; 324/307
(58) Field of Search .................... 324/318, 322, 324/321, 300, 307, 309

(56) References Cited

U.S. PATENT DOCUMENTS

| | | | | |
|---|---|---|---|---|
| 4,128,840 A | * | 12/1978 | Williams | 343/715 |
| 4,480,239 A | | 10/1984 | Hyde et al. | 333/219 |
| 4,680,548 A | | 7/1987 | Edelstein et al. | 324/318 |
| 4,692,705 A | | 9/1987 | Hayes | 324/318 |
| 5,144,240 A | | 9/1992 | Mehdizadeh et al. | 324/318 |
| 5,202,635 A | | 4/1993 | Srinivasan et al. | 324/322 |
| 5,212,450 A | | 5/1993 | Murphy-Boesch et al. | 324/309 |
| 5,445,153 A | | 8/1995 | Sugie et al. | 128/653.5 |
| 6,191,583 B1 | * | 2/2001 | Gerald et al. | 318/318 |

OTHER PUBLICATIONS

Article by Pascone et al., entitled "Generalized Electrical Analysis of Low–PAS and High–Pass Birdcage Resonators", published in *Magnetic Resonance Imaging*, vol. 9, pp. 395–408, 1991.

Article by James Tropp entitled "The Theory of the Bird–Cage Resonator", published in *Journal of Magnetic Resonance*, vol. 82, pp. 51–62, 1989.

* cited by examiner

*Primary Examiner*—Hezron Williams
*Assistant Examiner*—Brij B. Shrivastav
(74) *Attorney, Agent, or Firm*—Bella Fishman; Andrei Popovici

(57) ABSTRACT

A re-entrant radio-frequency (RF) $TE_{11}$-mode cavity resonator allows generating a spatially homogeneous RF magnetic field for magnetic resonance (NMR, MRI) applications. The azimuthal current distribution is truly (continuously) sinusoidal. Moreover, the geometry allows tuning the cavity resonance frequency over a wide range. The resonator includes an outer cylindrical shell, and an inner re-entrant shell extending only along the ends of the outer shell. The magnetic resonance target of interest is placed in the middle region of the outer cylindrical shell. Multiple re-entrant inner shells can be used, particularly if multiple resonances are desirable. The resonator can be driven capacitively or inductively, for example by placing excitation loops in the space between the outer and inner shell. Multiple excitation loops are used to drive the resonator in quadrature. The resonance frequency of the cavity can be tuned by rotating tuning paddles placed between the inner and outer shells.

19 Claims, 4 Drawing Sheets

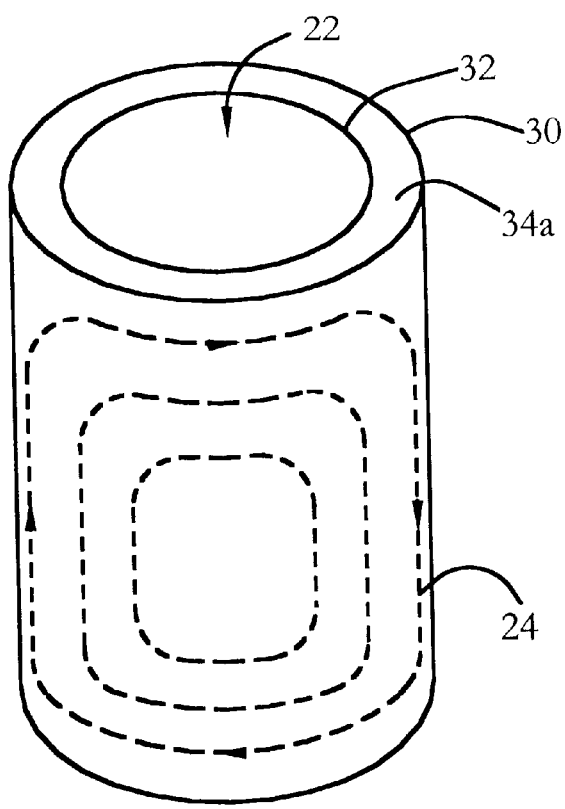
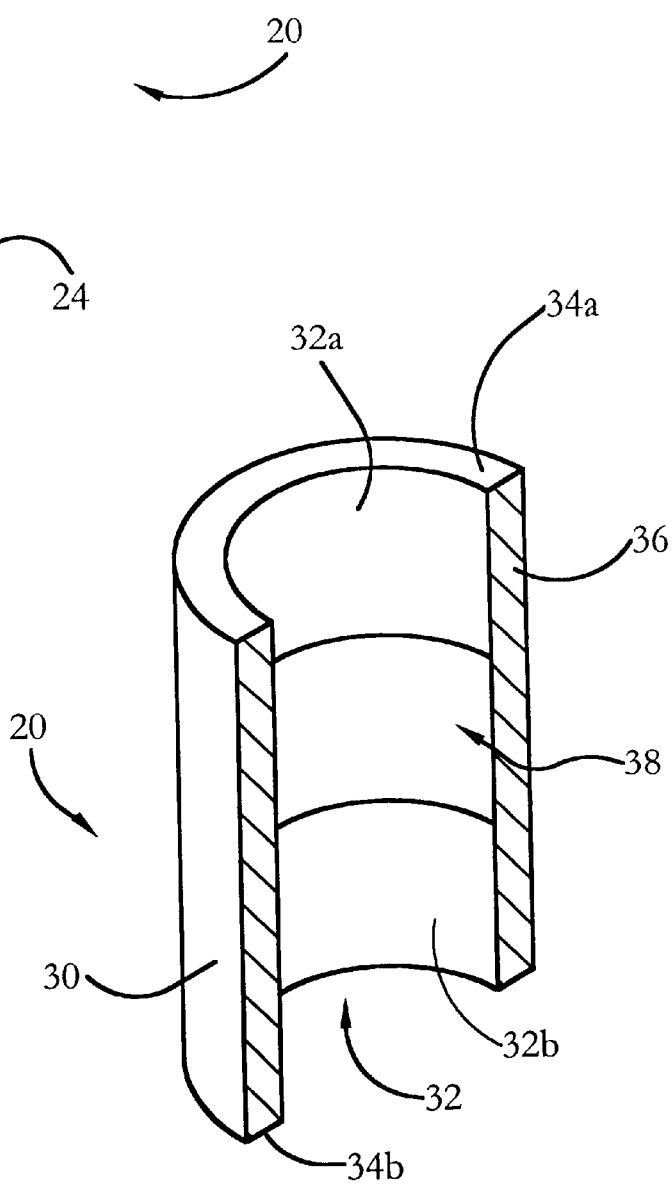
FIG. 1-A
FIG. 1-B

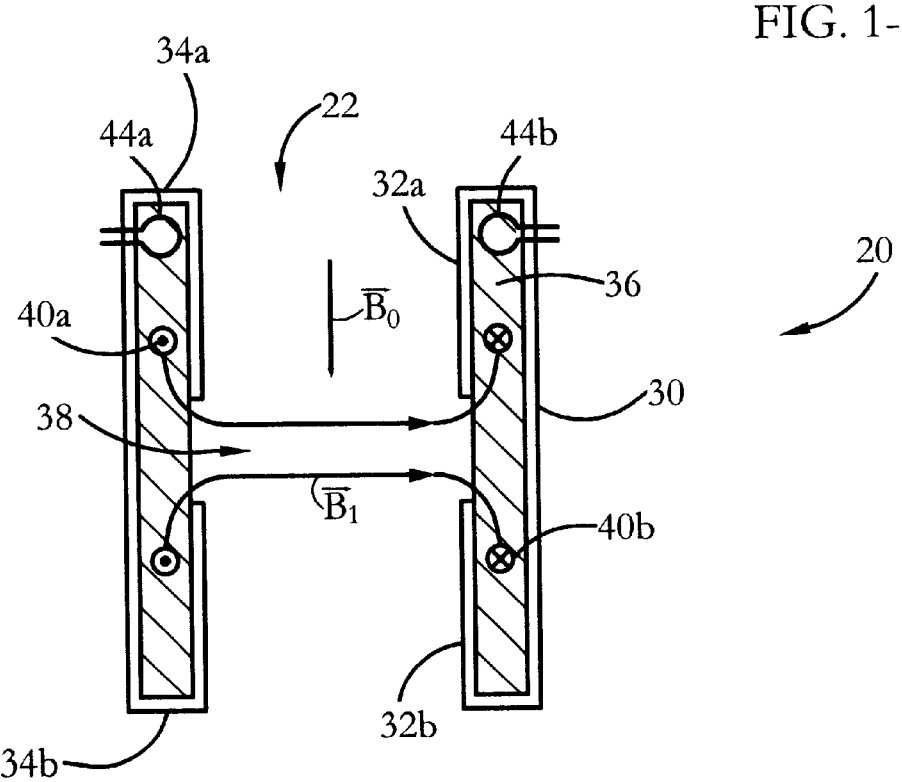
FIG. 1-C
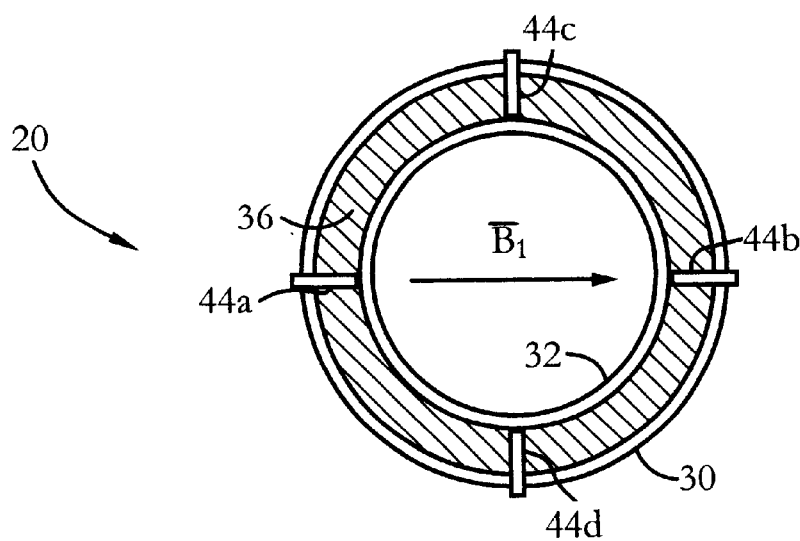
FIG. 1-D

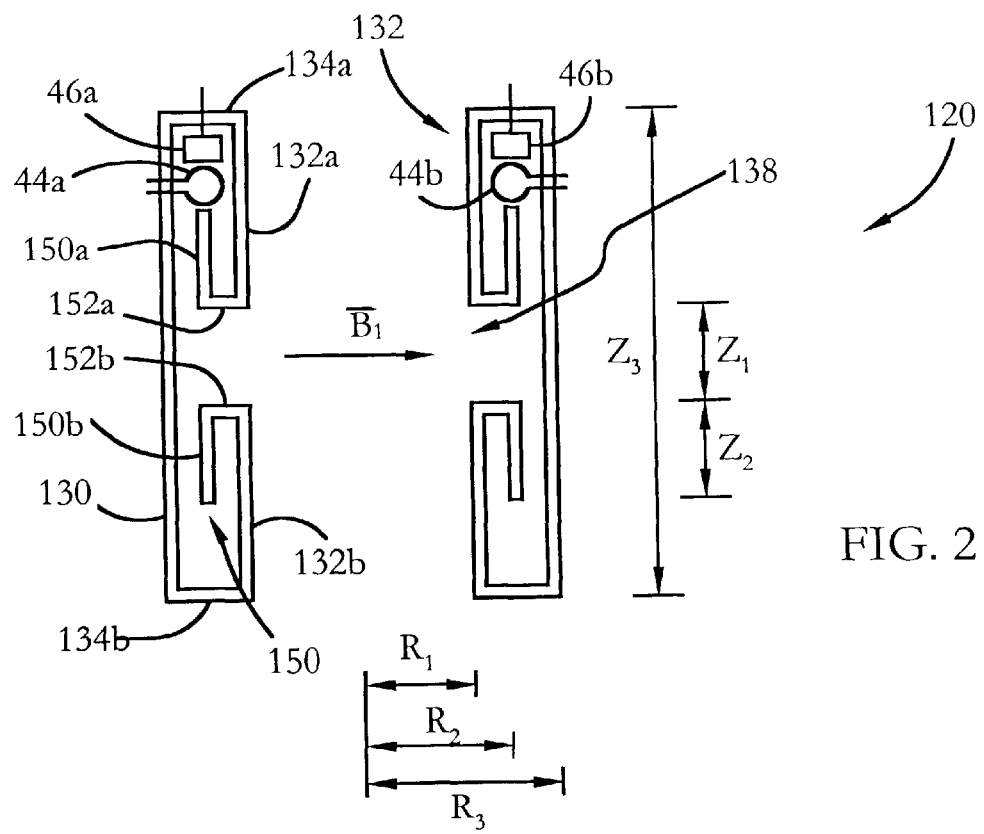
FIG. 2
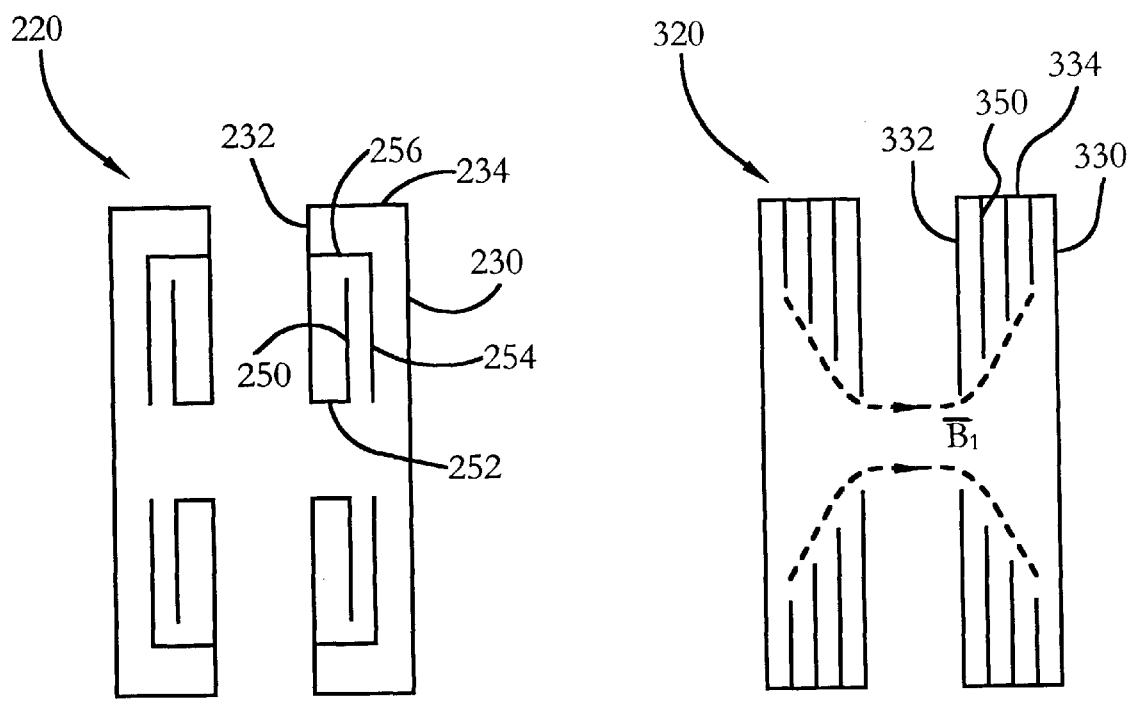
FIG. 3
FIG. 4

RE-ENTRANT RF CAVITY RESONATOR FOR MAGNETIC RESONANCE

FIELD OF THE INVENTION

The invention in general relates to magnetic resonance applications such as nuclear magnetic resonance (NMR) spectroscopy and magnetic resonance imaging (MRI), and in particular to a cavity resonator for applying a radio-frequency (RF) magnetic field to a target of interest.

BACKGROUND OF THE INVENTION

Nuclear magnetic resonance (NMR) spectrometers and magnetic resonance imaging (MRI) devices typically include a superconducting magnet for generating a static magnetic field $B_0$, and a special-purpose radio-frequency (RF) coil for generating a time-varying magnetic field $B_1$ perpendicular to the field $B_0$. In NMR applications, the RF coil is typically provided as part of an NMR probe, and is used to analyze samples situated in test tubes or flow cells. For typical MRI applications, the RF coil is used to analyze tissue or part of a patient. The direction of the static magnetic field $B_0$ is commonly denoted as the z-axis, while the plane perpendicular to the z-axis is commonly termed the x-y or θ-plane. In the following discussion, the term "longitudinal" is used to refer to the z-direction, while the term "transverse" is used to refer to the θ-direction.

The RF coil resonates at the Larmor frequency of the nuclei of interest. A commonly used RF coil geometry is the "birdcage" geometry, described for example by Hayes in U.S. Pat. No. 4,692,705. Hayes describes a coil including a pair of generally transverse conductive endcap elements. The endcap elements are separated along the longitudinal direction. A plurality of longitudinal segments interconnect the endcap elements, and are spaced apart along the peripheries of the endcap elements. Each of the segments has a reactive element connected in series therewith.

Hayes teaches that a perfectly uniform magnetic field $B_1$ can, in principle, be produced in an infinitely long cylinder with a surface current parallel to the cylinder axis and proportional to sin, where is the polar position along the circumference of the cylinder. For a short coil, however, the field is not uniform near the coil ends. Hayes teaches that it is theoretically possible to construct a short coil with the uniformity of an infinitely long coil, by intersecting the coil with an infinitely long conductive sheet perpendicular to the cylinder's axis. Hayes concludes that such a coil design is not practical, however, and proposes his birdcage geometry. The current through the longitudinal segments of Hayes follows a step-wise quasi-sinusoidal pattern, as illustrated in FIG. 5B of Hayes.

Other U.S. Patents describing RF resonator designs include U.S. Pat. No. 5,445,153 (Sugie et al.), U.S. Pat. No. 4,680,548 (Edelstein et al.), U.S. Pat. No. 5,144,240 (Mehdizadeh et al.), U.S. Pat. No. 5,202,635 (Srinivasan et al.), U.S. Pat. No. 5,212,450 (Murphy-Boesch et al.), and U.S. Pat. No. 4,480,239 (Hyde et al.). Information on the theory of birdcage resonators can be found in articles by Tropp, "The Theory of Birdcage Resonators," *J. Mag. Resonance*, 82:51–62 (1989), and Pascone et al., "Generalized Electrical Analysis of Low-Pass and High-Pass Birdcage Resonators," *Mag. Resonance Imaging*, 9:345–408 (1991).

SUMMARY OF THE INVENTION

The present invention provides a radio-frequency cavity resonator for nuclear magnetic resonance applications such as NMR and MRI. The resonator includes an outer conductive cylindrical shell, and an inner conductive re-entrant cylindrical shell laterally enclosed by the outer shell. The inner shell extends along the ends of the outer shell but not along a middle region of the outer shell. A target region for placing the magnetic resonance target of interest is defined in the middle region of the outer cylindrical shell. The space between the inner and outer shells may be filled by a dielectric.

The resonator is driven capacitively or inductively, for example by placing excitation loops in the space between the outer and inner shells. The resulting azimuthal current distribution is truly (continuously) sinusoidal, and the transverse magnetic field B, is spatially homogeneous within the target region. The design is relatively simple to construct and allows high Q-factors, wide tuning ranges for given cavity sizes, and relatively homogeneous transverse magnetic fields. The present invention further provides multiply-resonant cavity resonators comprising one or more intermediate conductive shells situated between the inner and outer shells.

BRIEF DESCRIPTION OF THE DRAWINGS

The foregoing aspects and advantages of the present invention will become better understood upon reading the following detailed description and upon reference to the drawings where:

FIG. 1-A shows an isometric view of a radio-frequency (RF) cavity resonator according to the preferred embodiment of the present invention.

FIG. 1-B shows an isometric view of half of the resonator of FIG. 1-A, cut along a longitudinal direction.

FIGS. 1-C and 1-D show longitudinal and transverse sectional views of the resonator of FIG. 1-A, respectively.

FIG. 2 shows a longitudinal sectional view of a cavity resonator according to an alternative embodiment of the present invention.

FIG. 3 shows a schematic transverse sectional view of a cavity resonator according to another alternative embodiment of the present invention.

FIG. 4 shows a schematic longitudinal sectional view of a cavity resonator according to yet another alternative embodiment of the present invention.

DETAILED DESCRIPTION OF THE INVENTION

Figure 5:
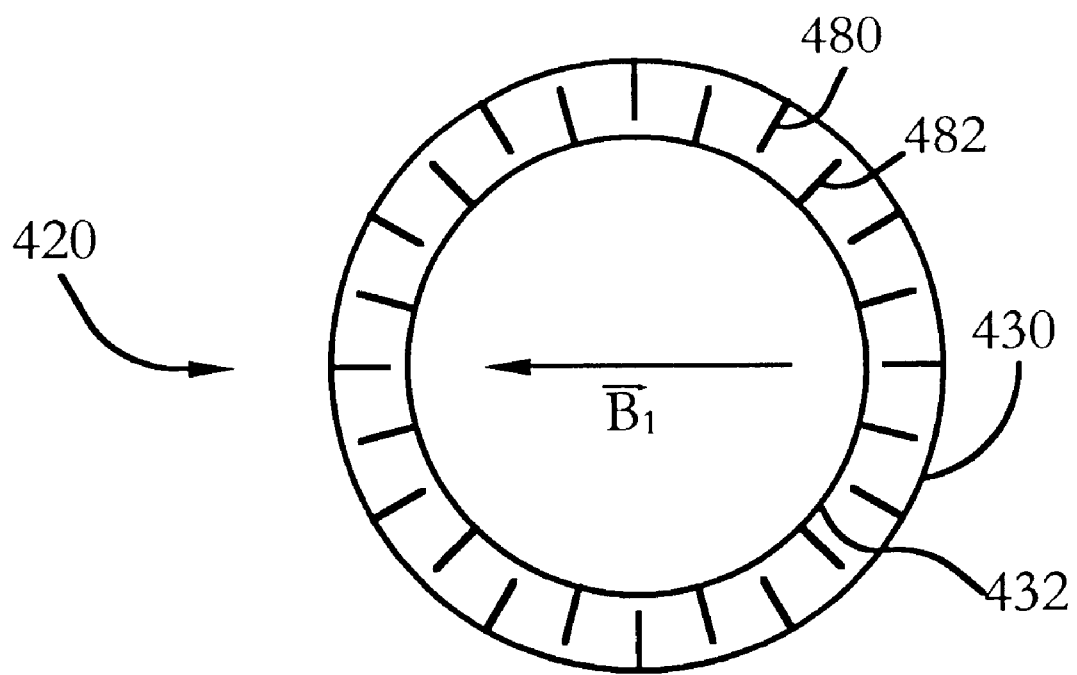
FIG. 5 shows a schematic transverse sectional view of a cavity resonator according to still another alternative embodiment of the present invention.

In the following description, the term "longitudinal" is understood to refer to the magnetic field z-axis. The terms "transverse" and "azimuthal" refer to the x-y (or –) plane defined by the magnetic field. The term "nuclear magnetic resonance target" is understood to encompass NMR and MRI samples and targets. A set of elements is understood to consist of one or more elements.

The following description illustrates embodiments of the invention by way of example and not necessarily by way of limitation.

FIG. 1-A shows an isometric view of a radio-frequency (RF) cavity resonator 20 according to the preferred embodiment of the present invention. FIG. 1-B shows an isometric view of half of the resonator 20, cut along a longitudinal direction. Resonator 20 is preferably substantially cylindrical, with the longitudinal axis of the cylinder coinciding with the magnetic field Z-axis. Resonator 20 has an inner cylindrical bore 22 for holding a nuclear magnetic resonance target of interest. For NMR, the target of interest may be a sample held in a test tube. For MRI, the target of interest may include tissue or part of a patient.

Resonator 20 includes an electrically conductive, substantially longitudinal external shell 30, a conductive re-entrant longitudinal internal shell 32, and conductive, generally transverse annular caps 34a–b connecting external shell 30 and internal shell 32. Internal shell 32 comprises two separate re-entrant shells (parts) 32a–b extending over distinct longitudinal extents of external shell 30. Shells 32a–b extend along opposite longitudinal ends of external shell 30, and are disposed symmetrically with respect to the middle of external shell 30 (the z=0 plane). Internal shells 32a–b are connected to external shell 30 by caps 34– b, respectively, at opposite longitudinal extremities of shell 30. The space between shells 30 and 32a–b is preferably filled by a dielectric shell 36.

Internal shells 32a–b are separated longitudinally. The longitudinal separation between shells 32a–b defines a magnetic field target region 38 for applying a generally transverse, $TE_{11}$-mode radio-frequency (RF) magnetic field $B_1$ to the target of interest. The target of interest is inserted into resonator 20 through bore 22, and rests within target region 38 as the target's response to the applied magnetic field is measured using conventional measurement components.

Conductive shells 30, 32, and annular caps 34a–b are formed by a conventional conductive material such as aluminum or copper. Dielectric shell 36 is preferably formed by a high-Q dielectric such as polytetrafluoroethylene (PTFE, teflon). Other suitable dielectrics include plastics, ceramics, and glasses. For example, conductive shells 30, 32 can be formed from standard acrylic tubes wrapped with adhesive copper foil. End caps 34 are then electrically and mechanically joined to the tubes. The electrical connection allows the flow of RF current. In general, the conductive sections of resonator 20 can be formed by a single monolithic part or by distinct, interconnected parts.

The diameter and length of external shell 30 are preferably on the order of a few millimeters to tens of centimeters, depending on the desired application, target size, and resonant frequency. For example, the resonator diameter can be on the order of 10 mm for a 900 MHz high-resolution quadrature spectroscopy probe, or on the order of 20 cm for a 200 MHz magnetic resonance imaging device. The transverse cross-sections of shells 30, 32 and caps 34a–b are preferably substantially uniform and circular.

FIGS. 1-C show longitudinal and transverse cross-sectional views of resonator 20, respectively, illustrating schematically the orientation of the RF magnetic field $B_1$ within resonator 20. The field lines shown in FIG. 1-C are for a snapshot in time when the entire resonator energy is in the magnetic field. Broadly speaking, the magnetic field lines are oriented substantially tangentially in the space between external shell 30 and internal shell 32, as illustrated in FIG. 1-C by field lines 40a coming out of the plane of the page and field lines 40b going into the plane of the page. Within target region 38, the radio-frequency $TE_{11}$-mode magnetic field is oriented transversely and is spatially homogeneous.

As shown in FIGS. 1-C and 1-D, a plurality of radio-frequency excitation coupling loops 44a–d are positioned in the space between external shell 30 and internal shell 32. Loops 44a–d are electrically connected to one or more external radio-frequency generators (not shown) situated outside of resonator 20. Preferably, loops 44a–d are all connected to a single RF generator. Appropriate phase-delay circuitry may be connected between each loop and the generator for imparting different phase delays to different loops, as explained in more detail below.

Loops 44a–d are inductively coupled to shells 30 and 32 along areas that are shielded from target region 38, such that loops 44a–d do not affect the spatial uniformity of the magnetic field within target region 38. Loops 44a–d are preferably disposed adjacent to annular cap 34a. Loops 44a–d are mutually aligned longitudinally, and are situated along the circumference of resonator 20 at =0°, 90°, 180°, and 270°, respectively. Each loop 44a–d is oriented radially and longitudinally, such that the magnetic field generated by current flow through each loop is oriented tangentially.

Resonator 20 is positioned within a bore of a conventional superconducting magnet (not shown), which applies a static magnetic field $B_0$ along the longitudinal axis of resonator 20 (Z-axis). Conventional readout components (not shown) are also coupled to the target of interest, for measuring the response of the target of interest to the applied magnetic field.

The external radio-frequency generator drives a radio-frequency current through coupler loops 44a–d. The magnetic field produced by current flow through coupler loops 44a–d induces a current flow through resonator 20. The current flow through resonator 20 generates the radio-frequency magnetic field $B_1$ within target region 38. Preferably, to produce a linearly-polarized magnetic field, only one pair of oppositely spaced loops (e.g. loops 44a and 44b) is driven with an 180° RF phase shift between the two loops. To produce a circularly-polarized magnetic field, the second pair of oppositely spaced loops (e.g. loops 44c and 44d) is driven in quadrature, with a phase shift of 90° relative to the first pair. In general, only one loop is sufficient for producing a linearly-polarized magnetic field. A circularly-polarized magnetic field can also be produced by driving only two orthogonally-oriented loops (e.g. loops 44a and 44c) in quadrature.

A snapshot of the general direction of current flow through resonator 20 is illustrated by the dashed pattern 24 in FIG. 1-A. Current flows through resonator 20 substantially longitudinally at =0° and =180°, and tangentially at =90° and =270°. As a function of the tangential position along the circumference of resonator 20, the distribution of longitudinal current flow is continuously (rather than stepwise) sinusoidal. The true sinusoidal current distribution generates a spatially-uniform, generally transverse $TE_{11}$-mode magnetic field within target region 38. The uniformity of the magnetic field improves the system signal to noise (S/N) ratio. By contrast, in a prior-art birdcage resonator such as the one described in the above-referenced U.S. Pat. No. 4,692,705, the longitudinal current distribution takes on discrete, step-wise sinusoidal steps.

The uniformity of the transverse magnetic field within target region 38 is enhanced by the presence of internal shell 32. Target region 38 is not exposed to fringe electric or magnetic fields which would otherwise degrade the system S/N performance. Target region 38 is shielded from the magnetic field lines generated by current flow through loops 44a–d. Moreover, the electric field is confined primarily to the space between external shell 30 and internal shell 32, away from target region 38.

The exact desired resonant frequency for resonator 20 is preferably determined and/or tailored empirically, using measurements. The dimensions and material (e.g. dielectric) properties can be chosen so that resonator 20 has a desired resonant frequency. In particular, internal shell 32 and dielectric 36 allow increasing the resonator capacitance and inductance for a fixed overall resonator size. Internal shell 32 and dielectric 36 remove the requirement that the cavity diameter be approximately equal to one free space wavelength (1.5 m at 200 MHz) and allow an increase in the tuning range available for a given resonator overall size. For example, in a practical implementation, a human-head-sized resonator can be built without difficulty to have a $TE_{11}$ resonant frequency in the range of 100 to 200 MHz. Also, the presently-preferred design described above allows Q-factors on the order of 1000–5000, which can be an order of magnitude higher than for typical birdcage resonators.

FIG. 2 shows a longitudinal sectional view of a multiply re-entrant cavity resonator 120 according to an alternative embodiment of the present invention. Resonator 120 includes multiple re-entrant conductive shells 132, 150 laterally enclosed by an external shell 130. An internal shell 132 includes two longitudinally-separated parts (shells) 132a–b connected to opposite ends of external shell 130 by transverse annular structures 134a–b, respectively.

An intermediate doubly-reentrant shell or choke joint 150 includes two distinct parts 150a–b situated in the transverse space between external shell 130 and internal shell 132. Each part 150a–b, shaped as a cylindrical shell, constrains the magnetic field in the space between external shell 130 and the corresponding internal shell 132a–b and provides additional capacitance to resonator 120. Parts 150a–b are connected to internal shells 132a–b by transverse annular structures 152a–b, respectively. Structures 152a–b are connected to internal shells 132a–b at or near the internal ends of internal shells 132a–b, opposite annular structures 134a–b with respect to internal shell 132a–b, respectively.

A set of excitation loops 44a–b and a set of conductive tuning paddles 46a–b are situated in the space between shells 130 and 132, and are inductively coupled to shells 130 and 132. Each of excitation loops 44a–b and tuning paddles 46a–b is rotatably mounted on a corresponding support, and is capable of rotating with respect to shells 130 and 132. Tuning paddles 46a–b short out a fraction of the magnetic flux that is proportional to their angle of rotation. Rotating tuning paddles 46a–b allows dynamically adjusting the $TE_{11}$ resonant frequency of resonator 120 without affecting the uniformity of the magnetic field in target region 138. Rotating loops 44a–b changes the mutual coupling of loops 44a–b to the $TE_{11}$ mode, and allows dynamically matching resonator 120 to particular loads.

As discussed above, the exact $TE_{11}$ resonant frequency of resonator 120 is preferably determined empirically. A rough estimate of the resonant frequency of resonator 120 can be determined by considering resonator 120 to be an LC circuit. The resonant frequency of resonator 120 is then $$\omega = \frac{1}{\sqrt{LC}} \quad [1]$$

where L and C are the inductance and capacitance of the circuit.

Consider now the approximation that the inductance L is determined by the magnetic field in target region 138 and in the space between internal shell 132 and external shell 130, while the capacitance C is given by the electrical field in the space between internal shell 132 and intermediate shell 150. The capacitance C and inductance L are then approximately $$C = \frac{2\pi\varepsilon_0\varepsilon_r}{\ln\left(\frac{R_3}{R_2}\right)}(2Z_2) \quad \text{and} \quad [2]$$

$$L = \frac{\mu_0}{2\pi}\ln\left(\frac{R_3}{R_1}\right)(2Z_1) \quad [3]$$

where $R_i$ and $Z_j$, i,j =1 . . . 3, are illustrated in FIG. 2. $R_{1-3}$ are the radii of internal shell 132, intermediate shell 150, and external shell 130, respectively. $Z_1$ is the longitudinal extent of the separation between shells 132a–b, while $Z_2$ and $Z_3$ are the longitudinal extents of each of intermediate shells 150a–b, and external shell 130, respectively.

Substituting eqs. [2] and [3] into eq. [1] yields $$\omega = \frac{1}{\sqrt{4\mu_0\varepsilon_0\varepsilon_r Z_1 Z_2 \frac{\ln\left(\frac{R_3}{R_1}\right)}{\ln\left(\frac{R_3}{R_2}\right)}}}. \quad [4]$$

As is apparent to the skilled artisan, the equations above rest on simplifying assumptions (e.g. neglecting edge effects, neglecting capacitances outside of the space between shells 132 and 150) and are only approximate. The above relations are given for general guidance purposes only, and are not intended to limit the invention.

FIG. 3 shows a longitudinal sectional view of a multiply re-entrant cavity resonator 220 according to another alternative embodiment of the present invention. Resonator 220 comprises a re-entrant internal shell 232 laterally enclosed by and connected to an external shell 230 through an annular structure 234 as described above. Plural intermediate shells 250, 254 extend between shells 230, 232, along part of the longitudinal extent of shell 232.

Intermediate shell 250 is situated between internal shell 232 and intermediate shell 254. Intermediate shell 250 is connected to internal shell 232 by an internal annular cap 252 situated at the internal end of internal shell 232. Intermediate shell 254 is situated between intermediate shell 250 and external shell 230. Intermediate shell 254 is connected to internal shell 232 by an annular cap 256 situated between the external end of internal shell 232 and the external end of intermediate shell 250.

Resonator 220 has two different modes that produce spatially-uniform RF magnetic fields within the target region. The two modes can be excited simultaneously or sequentially, allowing the simultaneous or sequential analysis of nuclear species with different resonant frequencies. The two modes can be excited using an external multiply-tuned excitation device comprising a loop or a coil (not shown). An external excitation loop or coil may be used if the two frequencies of interest are so close together that the spacing between adjacent nested shells does not permit the insertion of an internal excitation loop between the shells. Longitudinal slots can be cut in external shell 230 to allow the magnetic field generated by the external excitation device to penetrate resonator 220, without substantially disturbing the longitudinal current flow through external shell 230.

FIG. 4 shows a longitudinal sectional view of a multiply re-entrant cavity resonator 320 according to yet another alternative embodiment of the present invention. Resonator 320 comprises a re-entrant internal shell 332 laterally enclosed by and connected to an external shell 330 through an annular structure 334 as described above. A plurality of intermediate re-entrant shells 350 are situated between shells 330 and 332. The longitudinal extents of shells 350 increase sequentially from external shell 330 toward internal shell 332. Resonator 320 allows shaping the longitudinal profile of the RF magnetic field $B_1$.

FIG. 5 shows a transverse sectional view of a re-entrant cavity resonator 420 according to still another alternative embodiment of the present invention. Resonator 420 comprises an internal shell 432 laterally enclosed by and connected to an external shell 430 as described above. A first plurality of longitudinal slow-wave fins 480 extend radially from external shell 430 toward internal shell 432, without reaching internal shell 432. A second plurality of longitudinal slow-wave fins 482 extend radially from internal shell 432 toward external shell 430, without reaching external shell 430. Preferably, fins 480, 482 extend over the entire longitudinal extents of shells 430, 432, respectively. Fins 480, 482 are preferably interleaved. The -coordinates of fins 480 alternate with the -coordinates of fins 482. Slow-wave fins 480, 482 allow decreasing the resonator resonance frequency for a given resonator size.

It will be clear to one skilled in the art that the above embodiments may be altered in many ways without departing from the scope of the invention. For example, the cylindrical symmetry of the cavity resonator need not be perfect. The transverse cross-section of the resonator may be off-circular, e.g. elliptical, particularly if it desired to split the $TE_{11}$ degenerate modes. Various electromagnetic (e.g. capacitive or inductive) excitation devices and geometries may be used to drive the resonator, without disturbing the uniformity of the magnetic field in the target region of interest. Generally, one or more excitation devices may be used. To drive the resonator capacitively, a standard coaxial cable with a suitable matching network can be soldered to the resonator shells, with one terminal (e.g. the positive one) connected to the internal shell along its region of maximum electric field, and the other (e.g. ground) connected to the external shell. One or more longitudinal slots can be cut in the external shell, for allowing penetration of magnetic field lines inside the resonator without affecting the current flow along external shell. Such slots can be desirable if external excitation loops are used to drive the resonator. Accordingly, the scope of the invention should be determined by the following claims and their legal equivalents.

What is claimed is:

1. A radio-frequency cavity resonator for applying a radio-frequency magnetic field to a nuclear magnetic resonance target, comprising:
   a) a conductive longitudinal external shell;
   b) a first conductive re-entrant longitudinal internal shell, laterally enclosed by the external shell along a first longitudinal extent of the external shell;
   c) a first generally transverse external annular cap connecting the external shell and the first internal shell;
   d) a second conductive re-entrant longitudinal internal shell, laterally enclosed by the external shell along a second longitudinal extent of the external shell, wherein a longitudinal separation between the first longitudinal extent and the second longitudinal extent defines a magnetic field target region for applying a generally transverse radio-frequency magnetic field to the target; and
   e) a second generally transverse external annular cap connecting the external shell and the second internal shell, and situated substantially opposite the first annular cap.

2. The resonator of claim 1, further comprising:
   a) a third conductive longitudinal internal shell situated between the external shell and the first internal shell, extending along part of the first internal shell;
   b) a third transverse annular cap connecting the first internal shell and the third internal shell at an end of the first internal shell opposite the first annular cap;
   c) a fourth conductive longitudinal internal shell situated between the external shell and the second internal shell, extending along part of the second internal shell; and
   d) a fourth transverse annular cap connecting the second internal shell and the fourth internal shell at an end of the second internal shell opposite the second annular cap.

3. The resonator of claim 1, further comprising a radio-frequency excitation device electromagnetically coupled to at least one of the internal shell, the first internal shell, and the second internall shell, for driving the resonator to apply the transverse magnetic field to the target.

4. The resonator of claim 3, wherein the excitation device comprises a loop situated between the first internal shell and the external shell, and a radio-frequency generator electrically connected to the loop, for inductively driving the resonator.

5. The resonator of claim 3 wherein the excitation device comprises a plurality of loops situated between the first internal shell and the external shell, for inductively driving the resonator.

6. The resonator of claim 3 wherein the excitation device comprises a radio-frequency generator electrically connected to at least one of the external shell and the first internal shell, for applying a radio-frequency voltage across the resonator to capacitively drive the resonator.

7. The resonator of claim 1, further comprising a tuning device electromagnetically coupled to at least one of the internal shell, the first internal shell, and the second internall shell, for tuning a resonant frequency of the resonator.

8. The resonator of claim 1, further comprising a dielectric situated between the external shell and the first internal shell, and between the external shell and the second internal shell.

9. The resonator of claim 1, wherein at least one of the external shell and the first internal shell comprises a plurality of generally longitudinal slow-wave fins for decreasing a resonant frequency of the resonator, the fins extending radially in a space defined between the external shell and the first internal shell.

10. The resonator of claim 1 further comprising an intermediate internal re-entrant shell situated along only part of a longitudinal extent of the first internal shell, and connected to the first annular structure.

11. The resonator of claim 1 wherein the external shell, the first and second internal shells, and the first and second annular caps are formed by a monolithic conductive piece.

12. The resonator of claim 1 wherein each of the external shell, the first and second internal shells, and the first and second annular caps has a circular transverse cross-section.

13. A radio-frequency cavity resonator for applying a radio-frequency magnetic field in a nuclear magnetic resonance device, comprising:
   a) a conductive longitudinal external shell; and
   b) a conductive re-entrant longitudinal internal shell, comprising a first re-entrant part laterally enclosed by the external shell along a first longitudinal extent, and a second re-entrant part laterally enclosed by the external shell along a second longitudinal extent, wherein a longitudinal separation between the first extent and the second extent establishes a magnetic field target region for applying a generally transverse magnetic field to a nuclear magnetic resonance target.

14. A nuclear magnetic resonance apparatus comprising:
   a) a magnet for applying a longitudinal static magnetic field $B_0$ to a nuclear magnetic resonance target;
   b) a cavity resonator for applying a generally transverse radio-frequency magnetic field $B_1$ to the target, wherein the resonator comprises:
      a conductive longitudinal external shell, and
      a conductive re-entrant longitudinal internal shell, comprising a first re-entrant part laterally enclosed by the external shell along a first longitudinal extent, and a second re-entrant part laterally enclosed by the external shell along a second longitudinal extent, wherein a longitudinal separation between the first extent and the second extent establishes a magnetic field target region for applying the magnetic field $B_1$ to the target; and
   c) a radio-frequency excitation device electromagnetically coupled to the resonator, for inducing a continuously sinusoidal azimuthal current distribution in the resonator to drive the resonator at a $TE_{11}$ resonant frequency and thereby apply the magnetic field $B_1$ to the target.

15. The apparatus of claim 14 wherein the excitation device comprises a conductive loop positioned within the resonator cavity and inductively coupled to the resonator cavity.

16. The apparatus of claim 15 further comprising a tuning paddle inductively coupled to the resonator cavity, for tuning the $TE_{11}$ resonant frequency.

17. The apparatus of claim 14 wherein the excitation device comprises a plurality of conductive loops positioned within the resonator cavity and inductively coupled to the resonator cavity.

18. The resonator of claim 14 wherein the excitation device comprises a radio-frequency generator electrically connected to the resonator, for applying a radio-frequency voltage across the resonator to capacitively drive the resonator.

19. A method of applying a $TE_{11}$ radio-frequency magnetic field to a target in a nuclear magnetic resonance device, comprising the steps of:
   a) inserting the target in a target region of a radio-frequency cavity resonator comprising
      a conductive longitudinal external shell, and
      a conductive re-entrant longitudinal internal shell, comprising a first re-entrant part laterally enclosed by the external shell along a first longitudinal extent, and a second re-entrant part laterally enclosed by the external shell along a second longitudinal extent, wherein a longitudinal separation between the first extent and the second extent establishes the target region;
   b) driving the radio-frequency cavity resonator at a $TE_{11}$ resonant frequency to apply the magnetic field to the target; and
   c) measuring a response of the target to the magnetic field.

* * * * *

UNITED STATES PATENT AND TRADEMARK OFFICE
CERTIFICATE OF CORRECTION

PATENT NO. : 6,366,093 B1  Page 1 of 1
DATED : April 2, 2002
INVENTOR(S) : Hartman It is certified that error appears in the above-identified patent and that said Letters Patent is hereby corrected as shown below:

<u>Title page,</u>
Item [*], Notice, delete the phrase "by 0 days" and insert -- by 23 days --

Signed and Sealed this

Twenty-first Day of September, 2004

JON W. DUDAS
*Director of the United States Patent and Trademark Office*